United States Patent
Kim et al.

(10) Patent No.: US 7,951,765 B2
(45) Date of Patent: May 31, 2011

(54) PHOTORESIST STRIPPER COMPOSITION FOR SEMICONDUCTOR MANUFACTURING

(75) Inventors: Hyun Tak Kim, Suwon (KR); Seong Hwan Park, Cheongju (KR); Jung Hun Lim, Daejeon (KR); Sung Bae Kim, Seoul (KR); Chan Jin Jeong, Kongju (KR); Kui Jong Baek, Daejeon (KR)

(73) Assignee: Techno Semichem Co., Ltd., Gyeonggi-do (KR)

( * ) Notice: Subject to any disclaimer, the term of this patent is extended or adjusted under 35 U.S.C. 154(b) by 274 days.

(21) Appl. No.: 12/063,745

(22) PCT Filed: Aug. 5, 2006

(86) PCT No.: PCT/KR2006/003085
§ 371 (c)(1),
(2), (4) Date: Sep. 29, 2008

(87) PCT Pub. No.: WO2007/021085
PCT Pub. Date: Feb. 22, 2007

(65) Prior Publication Data
US 2009/0312216 A1 Dec. 17, 2009

(30) Foreign Application Priority Data

Aug. 13, 2005 (KR) .................. 10-2005-0074550
Aug. 3, 2006 (KR) .................. 10-2006-0073202
Aug. 3, 2006 (KR) .................. 10-2006-0073209

(51) Int. Cl.
*C11D 7/50* (2006.01)
(52) U.S. Cl. ...................................... 510/175; 510/176
(58) Field of Classification Search .................. 510/175, 510/176

See application file for complete search history.

(56) References Cited

U.S. PATENT DOCUMENTS

| 5,798,323 | A | * | 8/1998 | Honda et al. ............ 510/176 |
| 2003/0060382 | A1 | | 3/2003 | Lee et al. |

FOREIGN PATENT DOCUMENTS

| EP | 0578507 A2 | 1/1994 |
| EP | 0647884 A1 | 4/1995 |
| EP | 0678788 A2 | 10/1995 |
| EP | 1031884 A2 | 8/2000 |
| JP | 4289866 | 10/1992 |
| JP | 6266119 | 9/1994 |
| JP | 7069618 | 3/1995 |
| JP | 8262746 | 10/1996 |
| JP | 9096911 | 4/1997 |
| JP | 9152721 | 6/1997 |
| JP | 2002196509 | 7/2002 |
| KR | 20030025521 | 3/2003 |
| WO | 0182002 A1 | 11/2001 |

* cited by examiner

*Primary Examiner* — Gregory E Webb
(74) *Attorney, Agent, or Firm* — The Webb Law Firm

(57) ABSTRACT

The present invention relates to a photoresist stripper composition for removing the photoresist in the manufacturing process of the semiconductor device. More particularly, the photoresist stripper composition comprises 3-20 wt % of hydrazine hydrate or amine compound; 20~40 wt % of polar solvent; 0.01-3 wt % of corrosion inhibitor selected from the group consisting of imidazoline derivative, sulfide derivative, sulfoxide derivative, aromatic compound or aromatic compound with hydroxyl group; 0.01-5 wt % of monoalcohol compound of C2-C10; and 40-70 wt % of deionized water. The photoresist stripper composition for manufacturing the semiconductor can remove the photoresist film thermoset by hard bake, dry etching, ashing or ion implantation and denatured by the metallic by-product etched from the bottom metallic film in said process at low temperature easily and quickly, and minimize the corrosion of the bottom metallic wiring in the removing process of the photoresist.

6 Claims, 5 Drawing Sheets

[Fig. 1]
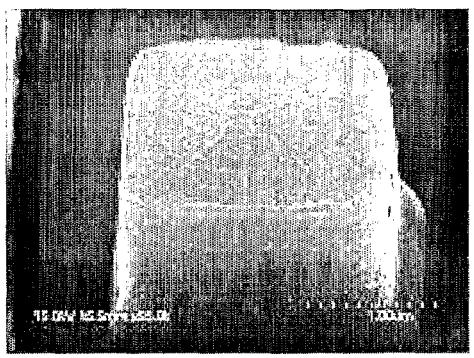
[Fig.2]
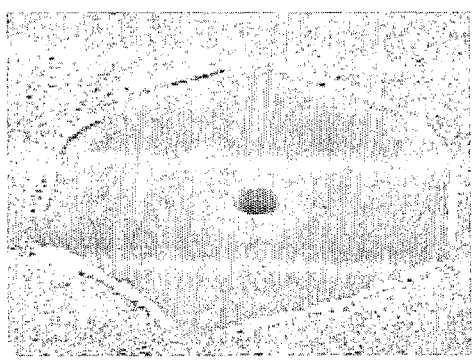
[Fig. 3]
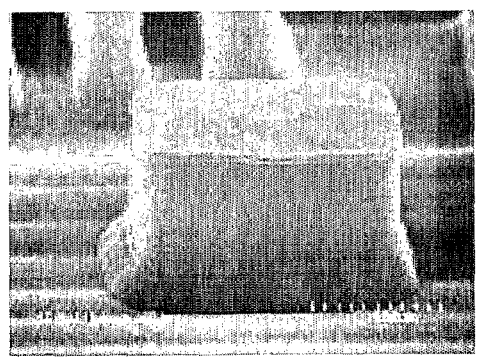
[Fig.4]

[Fig.5]
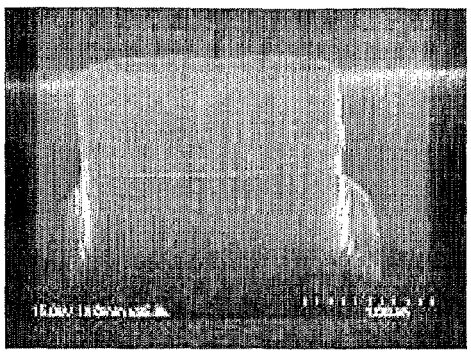
[Fig. 6]
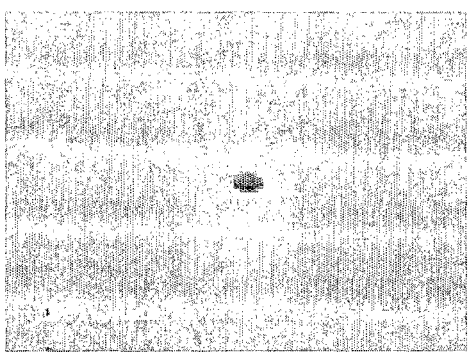
[Fig.7]
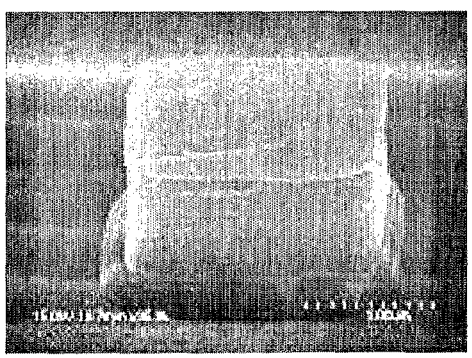
[Fig.8]
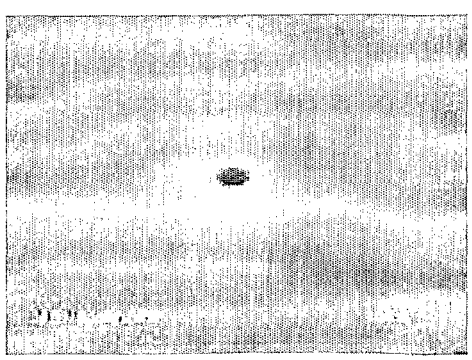

[Fig.9]
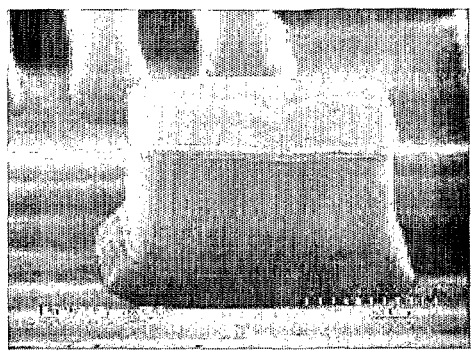
[Fig.10]
[Fig.11]
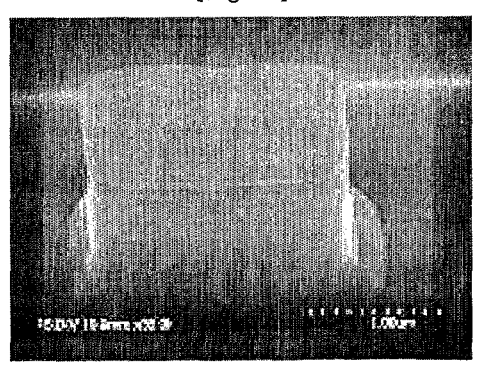
[Fig.12]
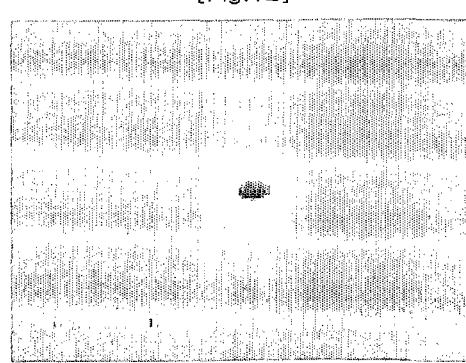

[Fig.13]
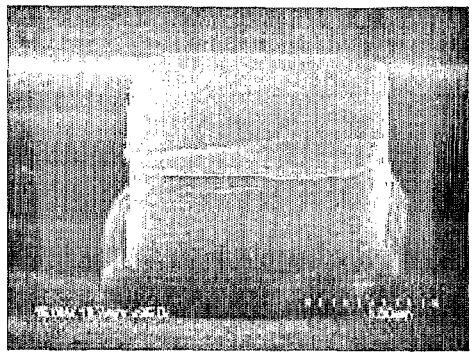
[Fig.14]
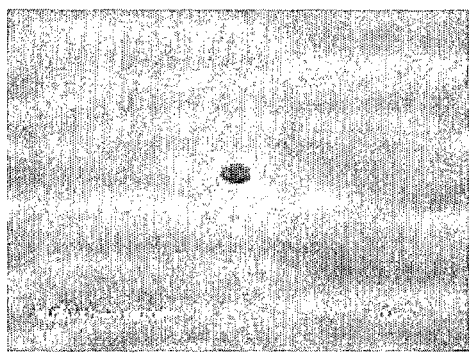
[Fig.15]
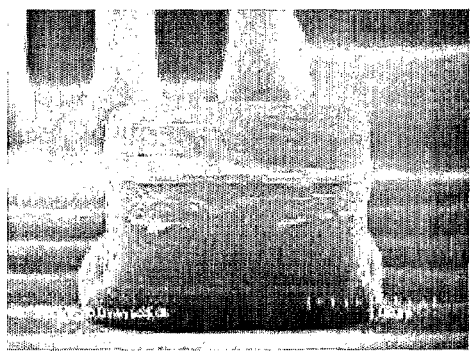
[Fig.16]
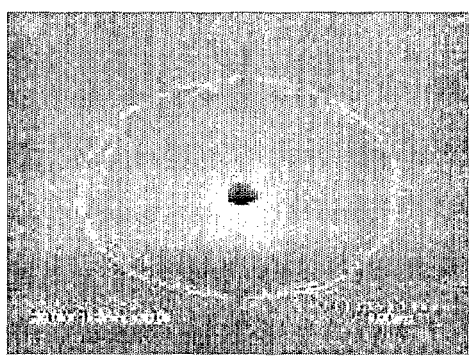

[Fig.17]
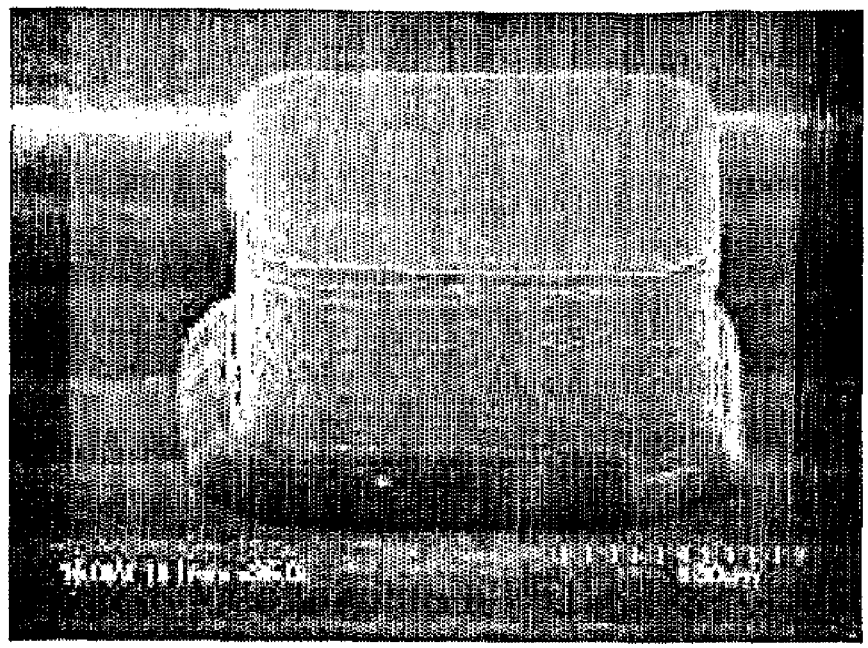
[Fig.18]
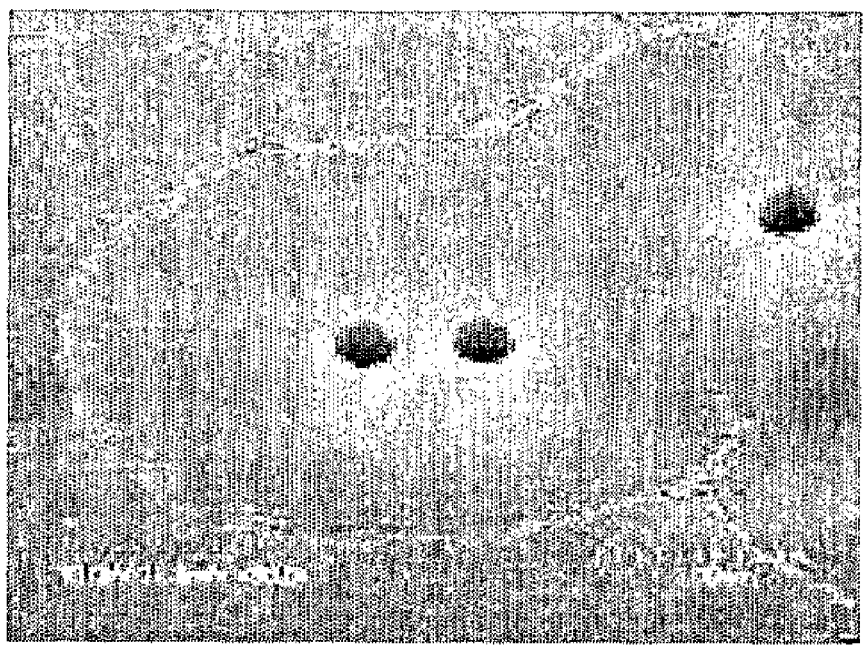

PHOTORESIST STRIPPER COMPOSITION FOR SEMICONDUCTOR MANUFACTURING

TECHNICAL FIELD

The present invention relates to a photoresist stripper composition for removing the photoresist in the manufacturing process of the semiconductor device. More particularly, the present invention relates to the photoresist stripper composition which can remove the photoresist film thermoset by dry etching, ashing or ion implantation after photolithography and the polymer, metallic by-product etched from the bottom metallic film in said process at low temperature easily and quickly, and minimize the corrosion of the bottom metallic wiring in the removing process of the photoresist.

BACKGROUND ART

Generally, the manufacturing process of the semiconductor device comprises the steps of: i) forming the pattern of photoresist on the conducting layer formed on the semiconductor substrate, and ii) forming the pattern of conducting layer using said pattern as a mask. The pattern of photoresist used as said mask has to be removed by the photoresist stripper on the conducting layer in the cleaning process followed after the forming process of said pattern of conducting layer. However, it is difficult to remove the photoresist in the following cleaning process because the dry etching is used as the lithography of conducting layer for forming the pattern of conducting layer in the manufacturing process of the semiconductor device recently.

The dry etching process replaces the wet etching process using the acidic liquid chemicals and performs the etching process by using the reaction of gas phase-solid phase between plasma gas and material layer like conducting layer. The dry etching process is the mainstream of etching process due to the ease of control and the formation of a sharp pattern recently. There are many kinds of dry etching, but it is difficult to remove the photoresist because the ion and radical in the plasma gas react with said photoresist film complicatedly on the surface of photoresist film in the etching process of conducting layer which makes the photoresist film thermoset rapidly. If the reactive ion etching (RIE) is used as an example of dry etching, it is difficult to remove the photoresist by using the current photoresist stripper with reproducibility.

Another example of the process which makes it difficult to remove the photoresist is ion implantation. In the manufacturing process of the semiconductor device, it is the diffusing process of the atoms such as P, As, B, etc. onto the certain area of silicon wafer to give the conductivity. In the ion implantation process, said ions are implanted onto the area of silicon wafer uncovered by the photoresist pattern, but at the same time, the surface of the photoresist pattern used as a mask during the process is denatured through the surface chemical reaction with the accelerated ion beams. Therefore, it is difficult to remove the photoresist film after the ion implantation process by using any solvent in the cleaning process.

The photoresist film after said dry etching or ion implantation process cannot be removed completely by using the current photoresist strippers. Although being removed, it is difficult to perform the cleaning process stably because it needs severe conditions such as high temperature over 100° C. and long dipping time. So, it increases the defect rate of the semiconductor device.

On the other hand, currently suggested photoresist stripper composition consisting of alkanol amine and diethylenegylcol monoalkyl ether has been used generally due to weak smell, low toxicity and efficient removal ability for the most photoresist films. However, said stripper composition is known not to able to sufficiently remove the photoresist film exposed to the plasma gas or ion beams during the process of dry etching or ion implantation process. Therefore, the development of new photoresist stripper composition is strongly required to remove the photoresist film denatured via the dry etching and ion implantation processes.

As described above, it is difficult to remove the photoresist film by using the photoresist stripper after ion implantation. Especially, it is more difficult to remove the photoresist film treated with the high dose of ion implantation to form the source/drain area in the manufacturing of very large scale integrated circuit (VLSI). During the ion implantation process, the surface of the photoresist film is thermoset by the reaction heat originating from the high dose of ion and the ion beams having the high energy. The semiconductor wafer is usually heated at the high temperature above 200° C. during the ashing process. At that time, the residual solvent inside the photoresist should be removed as a vapor, but it is impossible due to the thermoset layer formed on the surface of the photoresist after the high dose of ion implantation.

Further, as the pressure inside the photoresist film grows up in the ashing process, the surface of the photoresist film is ruptured by the residual solvent, which is called 'popping'. The surface thermoset layer scattered by popping forms fine dusts which are difficult to be removed. Because the said thermoset layer of photoresist surface is formed by the heat, the impurity ion, dopant, is substituted into the molecular structure of the photoresist to yield a crosslinking which is oxidized by $O_2$ plasma. The oxidized photoresist film forms fine dusts and particles which are the source of contamination and give decrease of production rate in the manufacturing of very large scale integrated circuit (VLSI).

As the photoresist stripper composition used in current wet cleaning process, the photoresist stripper composition prepared by mixing organic amine compound and many kinds of organic solvent is suggested. Especially, the photoresist stripper composition comprising monoethanolamine (MEA) as a necessary component among organic amine compounds is generally being used. However, the photoresist stripper comprising a small amount of deionized water still has a problem of pit formation on the bottom metallic wiring due to the reaction between amine and deionized water in the rinsing process.

In the manufacturing process of the semiconductor device recently, the condition of the process is so severe, for example, each device like silicon wafer is treated at high temperature of 110~140° C., that the photoresist often is baked at high temperature. But, said photoresist stripper cannot remove the photoresist baked at high temperature sufficiently. The photoresist stripper composition comprising water and/or hydroxylamine compound is disclosed as the composition for removing said photoresist baked at high temperature (Japanese laid-open patent publication 4-289866; Japanese laid-open patent publication 6-266119; Japanese laid-open patent publication 7-69618; Japanese laid-open patent publication 8-262746; Japanese laid-open patent publication 9-152721; Japanese laid-open patent publication 9-96911).

However, said photoresist stripper composition also cannot remove the photoresist film thermoset by dry etching, ashing and ion implantation and the photoresist film denatured by metallic by-product etched from the bottom metallic film in the said process sufficiently. Particularly, said photoresist stripper composition is not effective for removing denatured photoresist film produced at the sidewall of pattern if new metallic film is used, or new insulating material is used as an insulating film between layers in the process.

Further, the photoresist stripper composition using organic solvent as a main solvent has been used until now. But, the organic solvent is harmful environmentally and needs a high preparation cost.

On the other hand, the photoresist stripper composition comprising hydrazine hydrate as an antioxidant and water as a main solvent or cosolvent is disclosed (Korean laid-open patent publication 2003-0025521; Japanese laid-open patent publication 2002-196509). While the environment-friendly aspect of said composition is improved due to the high content of water compared to current photoresist stripper, if the content of water is more than 40%, the solubility of photoresist is decreased. Because of the low removal ability of photoresist, the application of said composition is limited.

The present inventors found that if the photoresist stripper composition comprising more than 40 wt % of water and hydrazine hydrate or amine compound and polar solvent contains the corrosion inhibitor selected from the group consisting of imidazoline derivative, sulfide derivative, sulfoxide derivative, aromatic compound or aromatic compound with hydroxyl group and monoalcohol compound of $C_2$~$C_{10}$, the reaction time and the corrosion of the bottom film is reduced remarkably in the removing process of thermoset or denatured photoresist.

DISCLOSURE OF THE INVENTION

Accordingly, an object of the invention is to provide the photoresist stripper composition being able to remove photoresist thermoset or denatured in the manufacturing process of the semiconductor effectively and minimize the corrosion of the metallic wiring on the bottom layer of the photoresist.

Another object of the invention is to provide the photoresist stripper composition being environment-friendly due to more than 40% of the content of deionized water and having a low preparation cost.

DETAILED DESCRIPTION OF THE INVENTION

The present invention provides the photoresist stripper composition used for removing photoresist in the manufacturing process of the semiconductor device like integrated circuit, large scale integrated circuit, very large integrated circuit and so on. More particularly, the photoresist stripper composition of the present invention comprises 3~20 wt % of hydrazine hydrate or amine compound; 20~40 wt % of polar solvent; 0.01~3 wt % of corrosion inhibitor selected from the group consisting of imidazoline derivative, sulfide derivative, sulfoxide derivative, aromatic compound or aromatic compound with hydroxyl group; 0.01~5 wt % of monoalcohol compound of $C_2$~$C_{10}$; and 40~70 wt % of deionized water.

Further, the photoresist stripper composition of the present invention comprises the composition more comprising ammonium salt compound of 0.01~3 wt % of the whole composition.

The photoresist stripper composition of the present invention has the characteristics of: i) removing thermoset or denatured photoresist film effectively and quickly, ii) causing no damage to the bottom metallic film, iii) producing no corrosion of bottom metallic wiring because of the easy removal in the rinse process due to more than 40% of the content of deionized water, iv) having a low preparation cost, v) reducing the cost of treating wastewater due to low content of organic solvent, and vi) being environment-friendly.

Hereinafter, the present invention is described in detail.

Said hydrazine hydrate or amine compound is used for removing the photoresist used in the manufacturing process of the semiconductor or photoresist film thermoset or denatured in the manufacturing process of the semiconductor. Said amine compound is one or more compound selected from the group consisting of alkyl($C_1$~$C_5$)-substituted primary amine, secondary amine or tertiary amine. The content of hydrazine hydrate or amine compound is 3~20 wt % of the whole composition, preferably 5~20 wt %. If the content of hydrazine hydrate or amine compound is less than 3 wt %, it is difficult to remove photoresist film of the sidewall denatured in the process of dry etching and ashing completely. If the content of hydrazine hydrate or amine compound exceeds 20 wt %, the corrosion of the bottom metallic film like aluminum can be induced.

The polar solvent contained in the present composition is selected from the group consisting of N-methylpyrrolidone (NMP), dimethylsulfoxide(DMSO), N,N-dimethylacetamide(DMAc), monomethyl foramide, methyl cellosolve, ethyl cellosolve, propyl cellosolve, butyl cellosolve or Methoxypropylacetate(PGMEA). Said polar solvent has the good solubility for the polymer resin and the good miscibility with water, so it can reduce the wetting time. The content of polar solvent is 20~40 wt % of the whole composition, preferably 25~35 wt %. If the content of polar solvent is less than 20 wt %, the swelling for the photoresist film of the sidewall removed is decreased, and the corrosion problem of the bottom metallic film is induced due to the characteristics of the hydrazine or amine compound. If the content of polar solvent exceeds 40 wt %, the swelling for photoresist film of the sidewall removed is increased, but it is difficult to remove the photoresist film due to the low content of the hydrazine or amine compound relatively.

The corrosion inhibitor contained in the present composition is selected from the group consisting of imidazoline derivative, sulfide derivative, sulfoxide derivative, aromatic compound or aromatic compound with hydroxyl group. The examples of said compound are 1-ethylamino-2-octadecylimidazoline, di-sec-butylsulfide, diphenylsulfoxide, benzoic acid, m-methylbenzoic acid, p-methylbenzoic acid, benzenacetic acid, 2-ethylbenzoic acid, 3-ethylbenzoic acid, 2,3,5-trimethylbenzoic acid, cinnamic acid, hydrocinnamic acid, 4-methylcinnamic acid, salicylic acid, 2-isopropylbenzoic acid, 3-isopropylbenzoic acid, 4-isopropylbenzoic acid, benzenebutanoic acid, 2,4-dimethylphenyl acetic acid, 2-(4-methylphenyl)propanoic acid, 4-propylbenzoic acid, 4-ethylphenyl acetic acid, 3-phenylbutanoic acid, 3-(2-methylphenyl)propionic acid, 3-(3-methylphenyl)propionic acid, p-methylhydrocinnamic acid, 3-propylbenzoic acid, cresol, gallic acid, methyl gallate, pyrogallol, hydroxylquinol, phloroglacinol, resorcinaol, hydroquinone and so on. The content of corrosion inhibitor is 0.01~3 wt %, preferably 0.1~3 wt %. If the content of corrosion inhibitor is less than 0.01 wt %, the corrosion of bottom metallic film is increased. If the content of corrosion inhibitor exceeds 3 wt %, there are some problems of the low removal ability of photoresist and the high price of the composition.

The monoalcohol contained in the present composition is the compound of alkyl($C_2$~$C_{10}$) or aralkyl having one hydroxyl group, and improves the uniformity in the removing process of the photoresist film and the reactivity of said hydrazine hydrate or amine compound and polar solvent. Said monoalcohol is one or more compound selected from the group consisting of butanol, ethanol, isopropanol, propanol, heptanol, octanol, decanol, benzyl alcohol, isohexanol and isooctanol. The content of monoalcohol is 0.01~5 wt % of the whole composition, preferably 0.1~5 wt %. If the content of monoalcohol is less than 0.01 wt %, it is not easy to remove the photoresist because it cannot increase the phase stability. If the content of monoalcohol exceeds 5 wt %, it is not economical from the industrial aspect considering the manufacturing cost of the composition.

The content of deionized water, the main component of the present composition is 40~70 wt % of the whole composition, preferably 45~65 wt %. If the content of deionized water is less than 40 wt %, it cannot maximize the productivity considering the manufacturing cost and the processing time. If the content of deionized water exceeds 70 wt %, the removal ability of the photoresist film is lowered considerably.

The composition of the present invention comprises ammonium salt compound additionally to prevent the damage of bottom metallic film. The content of ammonium salt compound is 0.01~3 wt % of the whole composition, preferably 0.1~3 wt %. If the content of ammonium salt compound is less than 0.01 wt %, the corrosion of bottom metallic film is induced. If the content of ammonium salt compound exceeds 3 wt %, the removal ability of the photoresist is lowered. Said ammonium salt compound is one or more mixture selected from the group consisting of ammonium benzoate ($C_6H_5CO_2NH_4$), ammonium carbonate (($NH_4$)$_2CO_3$), ammonium hydroxide ($NH_4OH$), ammonium acetate ($CH_3CO_2NH_4$), ammonium iodide ($NH_4I$), ammonium chloride, ammonium phosphate dibasic, ammonium phosphate monobasic, ammonium phosphate tribasic, ammonium persulfate, ammonium sulfate or ammonium nitrate.

EFFECT OF THE INVENTION

The photoresist stripper composition of the present invention has some advantages of: i) removing photoresist thermoset or denatured in the manufacturing process of the semiconductor quickly, ii) preventing the damage of the bottom metallic film in the removing process of the photoresist, iii) preventing the corrosion of the bottom metallic wiring because of the easy removal in the rinse process due to more than 40% of the content of deionized water, iv) having a low preparation cost and v) maximizing the productivity due to the decrease of wastewater and the reducing of the processing time.

BRIEF DESCRIPTION OF DRAWINGS

FIGS. 1 and 2 show the electron microscope photo of the metallic pattern before the treatment with the stripper composition. FIG. 1 is metallic wiring and FIG. 2 is via hole.

FIG. 3 shows the photo of metallic wiring treated with the composition prepared in preparation example 1 and FIG. 4 shows the photo of via hole treated with the composition prepared in preparation example 1.

FIG. 5 shows the photo of metallic wiring treated with the composition prepared in preparation example 2 and FIG. 6 shows the photo of via hole treated with the composition prepared in preparation example 2.

FIG. 7 shows the photo of metallic wiring treated with the composition prepared in preparation example 3 and FIG. 8 shows the photo of via hole treated with the composition prepared in preparation example 3.

FIG. 9 shows the photo of metallic wiring treated with the composition prepared in preparation example 4 and FIG. 10 shows the photo of via hole treated with the composition prepared in preparation example 4.

FIG. 11 shows the photo of metallic wiring treated with the composition prepared in preparation example 5 and FIG. 12 shows the photo of via hole treated with the composition prepared in preparation example 5.

FIG. 13 shows the photo of metallic wiring treated with the composition prepared in preparation example 6 and FIG. 14 shows the photo of via hole treated with the composition prepared in preparation example 6.

FIG. 15 shows the photo of metallic wiring treated with the composition prepared in comparative example 1 and FIG. 16 shows the photo of via hole treated with the composition prepared in comparative example 1.

FIG. 17 shows the photo of metallic wiring treated with the composition prepared in comparative example 2 and FIG. 18 shows the photo of via hole treated with the composition prepared in comparative example 2.

BEST MODE FOR CARRYING OUT THE INVENTION

This invention is explained in more detail based on the following Examples but they should not be construed as limiting the scope of this invention.

EXAMPLE 1

Preparation of Photoresist Stripper

The photoresist stripper was prepared according to preparation example 1~6 and comparative example 1~2.

TABLE 1

Photoresist stripper (unit: wt %)

| | Components | | | | | | | | | | |
|---|---|---|---|---|---|---|---|---|---|---|---|
| | Amine compound | | | | Polar solvent | | Mono | Corrosion inhibitor | | Ammonium compound | |
| | Hydrazine hydrate | Ethyl amine | diethylamine | Propyl amine | NMP* | Ethyl cellosolve | alcohol ethanol | pyrogallol | Methyl gallate | Ammonium nitrate | Deionized water |
| Prep. Ex. 1 | 11.7 | — | — | — | 31.8 | — | 1.1 | 2.0 | — | 2.0 | 51.4 |
| Prep. Ex. 2 | — | — | — | 14.3 | — | 31.8 | 1.1 | 2.0 | — | 2.0 | 48.8 |
| Prep. Ex. 3 | 11.7 | — | — | — | 31.8 | — | 1.1 | 2.5 | — | — | 52.9 |
| Prep. Ex. 4 | — | 4.3 | — | — | 31.8 | — | 1.1 | — | 0.8 | — | 62 |

TABLE 1-continued

Photoresist stripper (unit: wt %)

Components

| | Amine compound | | | Polar solvent | | Mono alcohol | Corrosion inhibitor | | Ammonium compound | |
|---|---|---|---|---|---|---|---|---|---|---|
| | Hydrazine hydrate | Ethyl amine | diethylamine | Propyl amine | NMP* | Ethyl cellosolve | alcohol ethanol | pyrogallol | Methyl gallate | Ammonium nitrate | Deionized water |
| Prep. Ex. 5 | — | — | 8.3 | — | 31.8 | — | 1.1 | — | 0.8 | — | 58 |
| Prep. Ex. 6 | — | — | — | 14.3 | 31.8 | — | 1.1 | — | 0.8 | — | 52 |

| | Mono-ethanol-amine | DMAc** | Catechol | N-methyl-morpholine-N-oxide | Hydroxylamine | Hydroxylamine sulfate | Deionized water |
|---|---|---|---|---|---|---|---|
| Comp. Ex. 1 | 7 | 34 | — | 8 | — | 14 | 37 |
| Comp. Ex. 2 | 49.5 | — | 5 | — | 28.9 | — | 16.6 |

*NMP: N-methyl pyrrolidone
**DMAc: N,N-dimethylacetamide

EXAMPLE 2

Preparation of Metallic Wiring Sample

A certain pattern was formed by common photolithography process after formation of silicon oxide layer on 8" silicon wafer and deposition of the metallic wiring with Ti/TiN 150 Å/Al 8000 Å/TiN 100 Å. The dry etching process was performed after preparation the sample having said photoresist (shifri UV-6) pattern.

The pattern of metallic wiring was formed by etching the bottom metallic wiring film uncovered with the photoresist pattern by using $CF_4/O_2$ gas mixture as an etching gas in dry etcher (Applied Material Co., model: P/5000). The samples of FIG. 1~3 was prepared by the ashing process using $O_2/N_2$ gas mixture as a reaction gas in ashing apparatus (Dongkyung Eunghwa Industries Co., model: TCA-2400).

| Condition of dry etching | Condition of ashing |
|---|---|
| Etching gas: $CF_4/O_2$ gas mixture | Used gas: $O_2/N_2$ gas mixture |
| Gas flux: 200/10 sccm | Gas flux: 950/50 sccm |
| Pressure: 20 mTorr | Pressure: 5 mTorr |
| RF Power: 400 W | Microwave Power: 1 kW |
| Magnetic field: 140 Gauss | Temperature of wafer: 200° C. |
| Etching time: 300 sec | Ashing time: 120 sec/wafer |

EXAMPLE 3

Performance Test of Photoresist Stripper

The sample of example 2 was dipped into the photoresist stripper prepared in preparation example 1~6 and comparative example 1~2 for metallic wiring and via hole formation processes. Different conditions are applied for each case (preparation example 1~6: at 55° C. for 8 min, comparative example 1: at 65° C. for 10 min, comparative example 2: at 70° C. for 20 min) to test removal of PR and corrosion of bottom metallic film. The results are summarized in Table 2.

TABLE 2

Comparison test of removal ability of photoresist and corrosion of the bottom metallic film

| | Removal of photoresist | | |
|---|---|---|---|
| | After PR ashing (metallic wiring formation process) | | After PR ashing (via hole formation process) |
| | Removal of PR | Corrosion of metallic film | Removal of PR |
| Ex. 1 | ⊚ | ⊚ | ⊚ |
| Ex. 2 | ⊚ | ⊚ | ⊚ |
| Ex. 3 | ⊚ | ⊚ | ⊚ |
| Ex. 4 | ⊚ | ⊚ | ⊚ |
| Ex. 5 | ⊚ | ⊚ | ⊚ |
| Ex. 6 | ⊚ | ⊚ | ⊚ |
| Comp. Ex. 1 | Δ | Δ | X |
| Comp. Ex. 2 | Δ | ○ | X |

*Removal of PR (complete removal: ⊚, removal: ○, normal: Δ, poor: X)
*Corrosion of the bottom metallic film (no corrosion: ⊚, partial pit: ○, severe pit: Δ, severe corrosion: X)

Table 2 shows the comparative results of the removal ability of the photoresist stripper of the present invention and the photoresist stripper currently used in the semiconductor process.

The photoresist was completely removed after ashing with the photoresist stripper of the present invention in the metallic wiring formation process and the via hole formation process, as presented in Table 2, FIG. 3~14. FIG. 3 and FIG. 4 show the electron microscope photo after treatment of the sample prepared in example 2 with the composition prepared in preparation example 1. FIGS. 5 and 6 are the results after treatment of the sample with the composition prepared in preparation example 2. FIGS. 7 and 8 are the results after treatment of the sample with the composition prepared in preparation example 3. FIGS. 9 and 10 are the results after treatment of the sample with the composition prepared in preparation example 4. FIGS. 11 and 12 are the results after treatment of the sample with the composition prepared in preparation example 5. FIGS. 13 and 14 are the results after treatment of the sample with the composition prepared in preparation example 6.

However, the photoresist was not removed completely by using the current photoresist stripper of comparative example 1 and 2. As shown in FIG. 15~18, the photoresist was left on the metallic wiring pattern. FIGS. 15 and 16 are the results after treatment of the sample with the composition prepared in comparative example 1. FIGS. 17 and 18 are the results after treatment of the sample with the composition prepared in comparative example 2. Therefore, the removal ability of the current photoresist stripper is lower than that of the photoresist stripper of the present invention. Further, the removal of photoresist was tested with several types of the metallic wiring patterns, which demonstrates a complete removal of the photoresist by using the photoresist stripper of the present invention irrespective of the pattern type.

It should be also noted that the photoresist stripper composition of the present invention shows no corrosion (relative to that of comparative example) for the bottom metallic film after ashing in the metallic wiring formation process and via hole formation processes, as shown in Table 2. The composition of comparative example 1 and 2 causes a partial corrosion, and shows lower removal ability than that of the present invention.

The photoresist stripper composition of the present invention performs an effective removal of the photoresist without corrosion of the metallic wiring at the low processing temperature of 55° C. for 8 min. Therefore, the photoresist stripper of the present invention is effective to reduce the processing time, environment-friendly due to high content of water, and economical due to low preparation cost.

INDUSTRIAL APPLICABILITY

The present invention provides the photoresist stripper composition which can quickly remove the photoresist thermoset or denatured in the manufacturing process of semiconductor without the damage of the bottom metallic film.

Further, the composition of the present invention can prevent the corrosion of the bottom metallic wiring because it can be easily removed by the following rinsing process due to more than 40% of the content of deionized water. It can also maximize the productivity by reducing the preparation cost, the amount of wastewater and the processing time.

The invention claimed is:

1. A photoresist stripper composition for manufacturing the semiconductor comprising 3~20 wt % of hydrazine hydrate or alkyl amine compound selected from the group consisting of alkyl($C_1$~$C_5$)-substituted primary amine, secondary amine and tertiary amine; 20~40 wt % of polar solvent; 0.01~3 wt % of corrosion inhibitor selected from the group consisting of 1-ethylamino-2-octadecylimidazoline, di-sec-butylsulfide, diphenylsulfoxide, benzoic acid, m-methylbenzoic acid, p-methylbenzoic acid, benzenacetic acid, 2-ethylbenzoic acid, 3-ethylbenzoic acid, 2,3,5-trimethylbenzoic acid, cinnamic acid, hydrocinnamic acid, 4-methylcinnamic acid, salicylic acid, 2-isopropylbenzoic acid, 3-isopropylbenzoic acid, 4-isopropylbenzoic acid, benzenebutanoic acid, 2,4-dimethylphenyl acetic acid, 2-(4-methylphenyl)propanoic acid, 4-propylbenzoic acid, 4-ethylphenyl acetic acid, 3-phenylbutanoic acid, 3-(2-methylphenyl)propionic acid, 3-(3-methylphenyl) propionic acid, p-methylhydrocinnamic acid, 3-propylbenzoic acid, cresol, gallic acid, methyl gallate, pyrogallol, hydroxylquinol, phloroglacinol, resorcinaol, or hydroquinone; 0.01~5 wt % of monoalcohol compound of $C_2$~$C_{10}$; and 40~70 wt % of deionized water.

2. The photoresist stripper composition of claim 1, wherein said polar solvent is one or more compound selected from the group consisting of N-methylpyrrolidone (NMP), dimethylsulfoxide(DMSO), N,N-dimethylacetamide(DMAc), monomethyl foramide, and Methoxypropylacetate(PG-MEA).

3. The photoresist stripper composition of claim 1, wherein said monoalcohol compound is one or more compound selected from the group consisting of butanol, ethanol, isopropanol, propanol, heptanol, octanol, decanol, benzyl alcohol, isohexanol and isooctanol.

4. The photoresist stripper composition of any one of claims 1, 2, and 3, wherein said composition more comprises ammonium salt compound of 0.01~3 wt % of total weight of the composition.

5. The photoresist stripper composition of claim 4, wherein said ammonium salt compound is one or more mixture selected from the group consisting of ammonium benzoate ($C_6H_5CO_2NH_4$), ammonium carbonate(($NH_4$)$_2CO_3$), ammonium hydroxide($NH_4OH$), ammonium acetate ($CH_3CO_2NH_4$), ammonium iodide($NH_4I$), ammonium chloride, ammonium phosphate dibasic, ammonium phosphate monobasic, ammonium phosphate tribasic, ammonium persulfate, ammonium sulfate and ammonium nitrate.

6. The photoresist stripper composition of claim 1, wherein deionized water is present in an amount of from 45 to 65 wt%.

* * * * *